United States Patent
Cho et al.

(10) Patent No.: US 7,846,787 B2
(45) Date of Patent: Dec. 7, 2010

(54) METHOD OF MANUFACTURING TRANSISTOR AND METHOD OF MANUFACTURING ORGANIC ELECTROLUMINESCENCE DISPLAY USING THE SAME

(75) Inventors: Kyu-Sik Cho, Suwon-si (KR); Joon-Hoo Choi, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/275,578

(22) Filed: Nov. 21, 2008

(65) Prior Publication Data

US 2010/0001284 A1 Jan. 7, 2010

(30) Foreign Application Priority Data

Jul. 1, 2008 (KR) .................. 10-2008-0063597

(51) Int. Cl.
H01L 21/00 (2006.01)
H01L 21/84 (2006.01)
H01L 27/14 (2006.01)
H01L 29/04 (2006.01)
H01L 29/15 (2006.01)
H01L 31/036 (2006.01)

(52) U.S. Cl. ................. 438/158; 257/72; 257/E21.414; 257/E29.003

(58) Field of Classification Search ............ 257/59, 257/72, E21.412–E21.414, E33.053, E21.134, 257/E29.275, E29.278, E29.294, 98, 222, 257/225, E33.054, E33.061, E31.095–E31.097, 257/E31.129, E29.003, E27.13; 438/34, 438/166, 308, 141, 153–158, 169, 172, 188, 438/189, 197, 199, 201–210, 234–241, 258, 438/266, 275–279, 309, 340

See application file for complete search history.

(56) References Cited

U.S. PATENT DOCUMENTS

| 5,262,344 | A * | 11/1993 | Mistry .................. 438/200 |
| 6,388,270 | B1 * | 5/2002 | Yamazaki et al. ........ 257/59 |
| 2007/0042536 | A1 * | 2/2007 | Chen et al. ............ 438/149 |
| 2008/0315207 | A1 * | 12/2008 | Yang et al. ............. 257/66 |

FOREIGN PATENT DOCUMENTS

| JP | 11330477 | 11/1999 |
| KR | 1019990036851 | 5/1999 |
| KR | 1020050098122 | 10/2005 |

OTHER PUBLICATIONS

Dictionary.com Unabridged. Random House, Inc. Mar. 22, 2010. <Dictionary.com http://dictionary.reference.com/browse/around>.*

* cited by examiner

*Primary Examiner*—Davienne Monbleau
*Assistant Examiner*—Monica D Harrison
(74) *Attorney, Agent, or Firm*—H.C. Park & Associates, PLC (57) ABSTRACT

A method of manufacturing a transistor and a method of manufacturing an organic electroluminescence display are disclosed. When an amorphous silicon layer is crystallized, a silicon oxide layer formed on a polysilicon layer is subsequently patterned. Impurity ions are implanted into first and second regions of the amorphous silicon layer to form first and second doped regions. The silicon oxide layer is patterned so that the silicon oxide layer may be removed from an ohmic contact region of the polysilicon layer, and covers only a channel region of the polysilicon layer.

6 Claims, 12 Drawing Sheets

METHOD OF MANUFACTURING TRANSISTOR AND METHOD OF MANUFACTURING ORGANIC ELECTROLUMINESCENCE DISPLAY USING THE SAME

CROSS-REFERENCE TO RELATED APPLICATION

This application claims priority from and the benefit of Korean Patent Application No. 10-2008-0063597 filed on Jul. 1, 2008, which is hereby incorporated by reference for all purposes as if fully set forth herein.

BACKGROUND OF THE INVENTION

1. Field of the Invention

The present invention relates to a method of manufacturing a transistor and a method of manufacturing an organic electroluminescence display using the same. More particularly, the present invention relates to a method of manufacturing a transistor that may have improved ohmic contact properties, and a method of manufacturing an organic electroluminescence display using the same.

2. Discussion of the Background

As the interest for flat panel displays has increased, research into organic electroluminescence displays, which are emissive displays that display bright images using a low voltage, has been actively conducted. An image is displayed by the organic electroluminescence display using an organic light emitting diode.

In the organic electroluminescence display, each pixel may include a gate line, a data line, a bias line, a driving transistor, and a switching transistor to control light transmittance of an organic light emitting diode. In particular, a crystallization process may be performed to form the driving transistor having a polysilicon active layer.

For the crystallization process a field enhanced rapid thermal annealing (FERTA) process may be performed under heat at the temperature of 700° C. or above. If the crystallization process is performed at this temperature, an undesired layer (e.g. a silicon oxide layer) is formed on the polysilicon layer. The silicon oxide layer is difficult to remove from the polysilicon layer even when an HF cleaning process is performed, as compared with a natural oxide layer.

As a result, the silicon oxide layer remaining on the polysilicon layer deteriorates ohmic contact properties between the polysilicon layer and source and drain electrodes of the driving transistor, thereby causing an increase in off current of the driving transistor.

SUMMARY OF THE INVENTION

The present invention provides a method of manufacturing a transistor that may have improved ohmic contact properties.

The present invention also provides a method of manufacturing an organic electroluminescence display using the above manufacturing method of a transistor.

Additional features of the invention will be set forth in the description which follows, and in part will be apparent from the description, or may be learned by practice of the invention.

The present invention discloses a method of manufacturing a transistor. A gate electrode is formed on a substrate. A gate insulating layer is formed on the substrate having the gate electrode. An amorphous silicon layer is formed on the gate insulating layer. First and second doped regions are formed in the amorphous silicon layer by implanting impurity ions into first and second regions of the amorphous silicon layer. A polysilicon layer is formed by crystallizing the amorphous silicon layer. A silicon oxide layer pattern is formed on a channel region of the polysilicon layer provided between the first and second doped regions. Source and drain electrodes are formed on the first and second doped regions, respectively. The silicon oxide layer pattern is not disposed on the first doped region and the second doped region.

The present invention also discloses a method of manufacturing an organic electroluminescence display. A driving transistor is formed on a substrate. A switching transistor electrically connected with an input terminal of the driving transistor is formed. An organic electroluminescence device electrically connected with an output terminal of the driving transistor is formed. To form the driving transistor, a gate electrode is formed on a substrate. A gate insulating layer is formed on the substrate having the gate electrode. An amorphous silicon layer is formed on the gate insulating layer. First and second doped regions are formed in the amorphous silicon layer by implanting impurity ions into first and second regions of the amorphous silicon layer. A polysilicon layer is formed by crystallizing the amorphous silicon layer. A silicon oxide layer pattern is formed on a channel region of the polysilicon layer provided between the first and second doped regions. Source and drain electrodes are formed on the first and second doped regions, respectively. The silicon oxide layer pattern is not disposed on the first doped region and the second doped region.

The present invention also discloses a thin film transistor including a substrate, a gate electrode, a gate insulating layer, a semiconductor layer, a silicon oxide layer pattern, and source and drain electrodes. The gate electrode is arranged on the substrate. The gate insulating layer is arranged on the gate electrode. The semiconductor layer is arranged on the gate insulating layer and has first and second doped regions and a channel region. The silicon oxide layer pattern is arranged on the channel region but not on the first doped region and the second doped region. The source and drain electrodes are arranged on the first and second doped regions, respectively.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Exemplary embodiments of the present invention will be described below with reference to the accompanying drawings.

FIG. 1A, FIG. 1B, FIG. 1C, FIG. 1D, FIG. 1E, FIG. 1F, FIG. 1G, FIG. 1H, FIG. 1I, FIG. 1J, FIG. 1K and FIG. 1L are sectional views illustrating a manufacturing method of a polysilicon transistor according to an exemplary embodiment of the present invention.

Figure 1A:
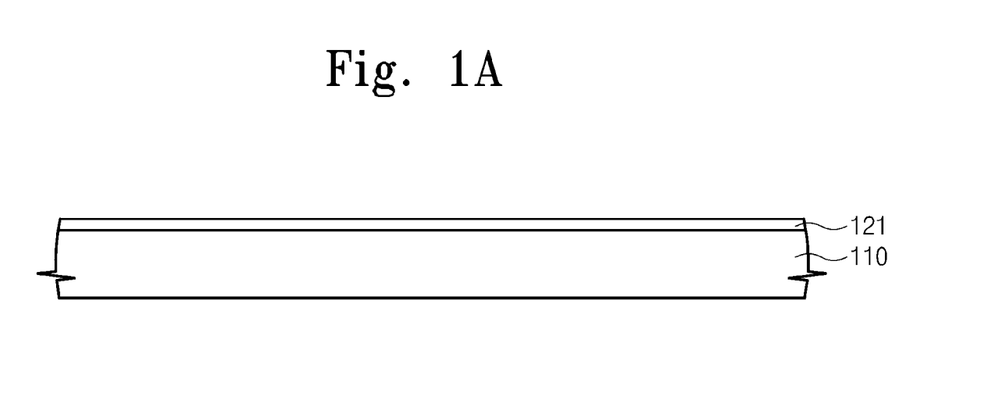
FIG. 1A, FIG. 1B, FIG. 1C, FIG. 1D, FIG. 1E, FIG. 1F, FIG. 1G, FIG. 1H, FIG. 1I, FIG. 1J, FIG. 1K and FIG. 1L are sectional views illustrating a method of manufacturing a polysilicon transistor according to an exemplary embodiment of the present invention.

Referring to FIG. 1A, a gate metal layer 121 having a single layer or a multi-layer is formed on a transparent insulating substrate 110 by depositing metal such as chrome, molybdenum, aluminum, silver or an alloy thereof through a sputtering method. In the present exemplary embodiment, the gate metal layer 121 includes molybdenum and has a thickness of about 500 Å to about 3000 Å.

Figure 1B:
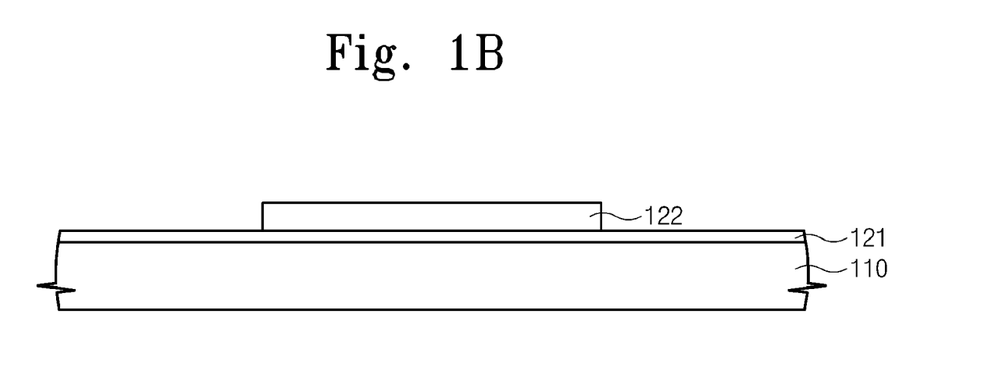
Figure 1C:
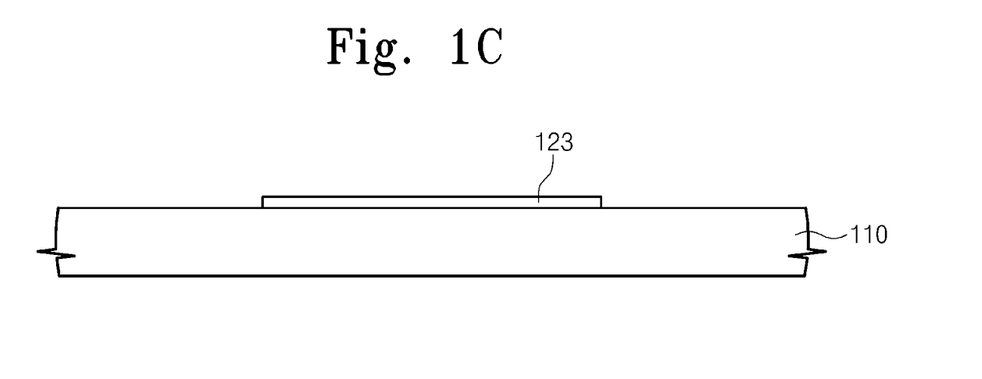

As illustrated in FIG. 1B, a first photoresist pattern 122 is formed on a position at which a gate electrode is to be formed, and the gate metal layer 121 is etched through a photolithography process using the first photoresist pattern 122 as a mask, thereby forming a gate electrode 123 on the substrate 110 as illustrated in FIG. 1C.

Figure 1D:
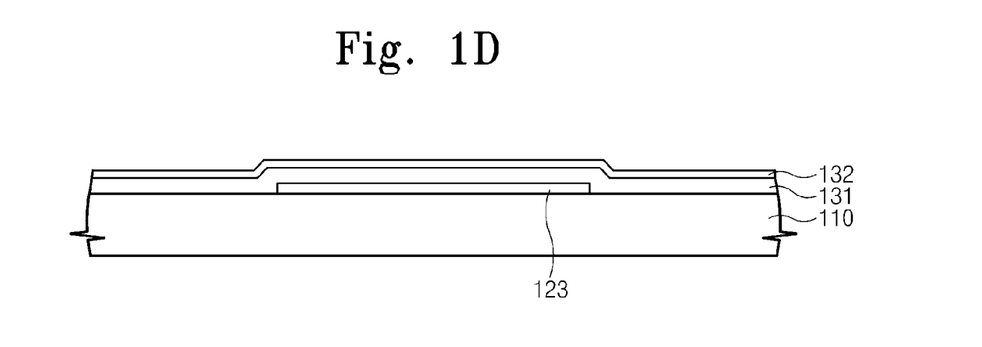

Referring to FIG. 1D, a gate insulating layer 131 and an amorphous silicon layer 132 are sequentially formed on the substrate 110 on which the gate electrode 123 is formed. The gate insulating layer 131 includes a silicon oxide (SiOx) layer and has a thickness of about 500 Å to about 3000 Å. The amorphous silicon layer 132 is deposited on the gate insulating layer 131 with a thickness of about 200 Å to about 2000 Å.

Figure 1E:
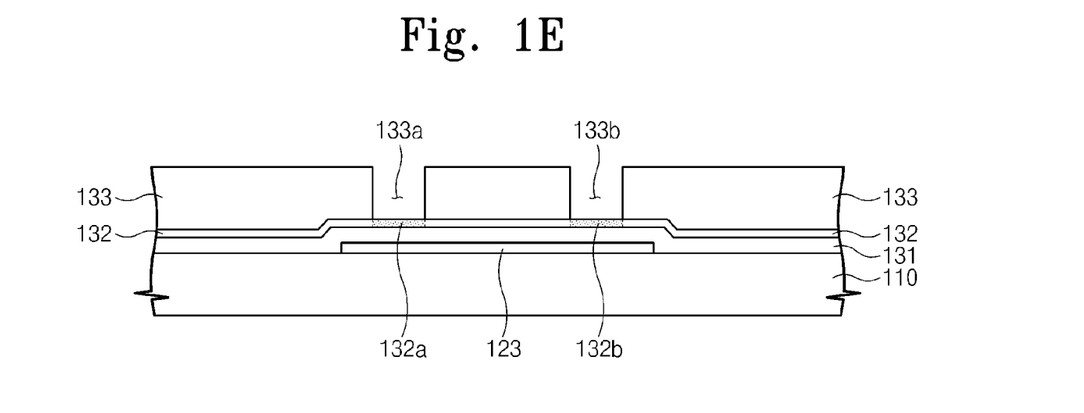

Next, referring to FIG. 1E, a second photoresist pattern 133 is formed on the amorphous silicon layer 132. First and second openings 133a and 133b are formed in the second photoresist pattern 133 to expose the amorphous silicon layer 132. In the present exemplary embodiment, the second photoresist pattern 133 is a positive photoresist. Ions including phosphor (P+) or boron (B+) are implanted into portions of the amorphous silicon layer 132 exposed through the first and second openings 133a and 133b, thereby forming n+ and p+ doped regions 132a and 132b in the amorphous silicon layer 132. Regions of the amorphous silicon layer 132 that are not exposed by the first and second openings 133a and 133b are defined as undoped regions. After the ion implantation process is completed, the second photoresist pattern 133 is removed.

Figure 1F:
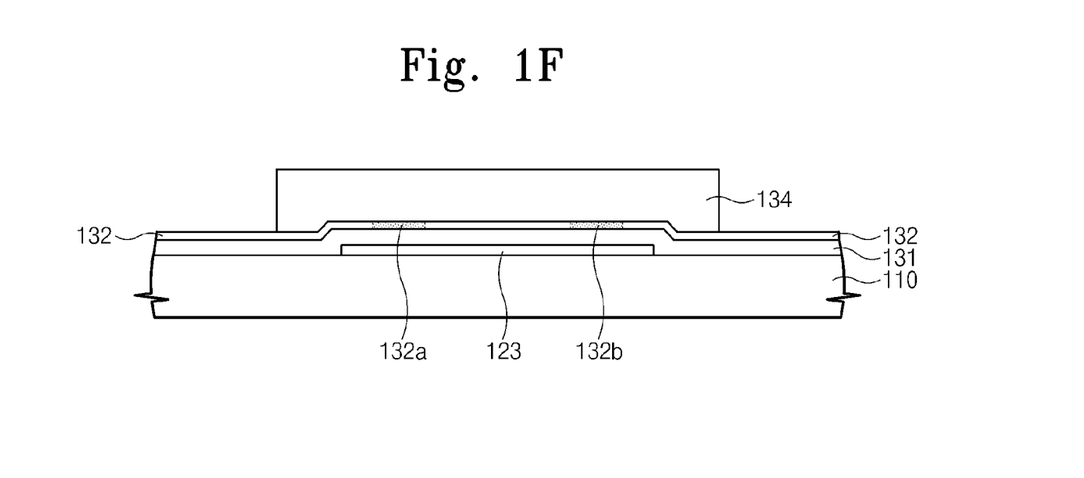

Referring to FIG. 1F, a third photoresist pattern 134 is formed on the amorphous silicon layer 132. The amorphous silicon layer 132 is etched through a photolithography process using the third photoresist pattern 134 as a mask, thereby forming an active pattern 135. Then, the active pattern 135 (FIG. 1G) is crystallized through a field enhanced rapid thermal annealing (FERTA) process. The FERTA process is performed under heat at the temperature of about 700° C. or above.

Figure 1G:
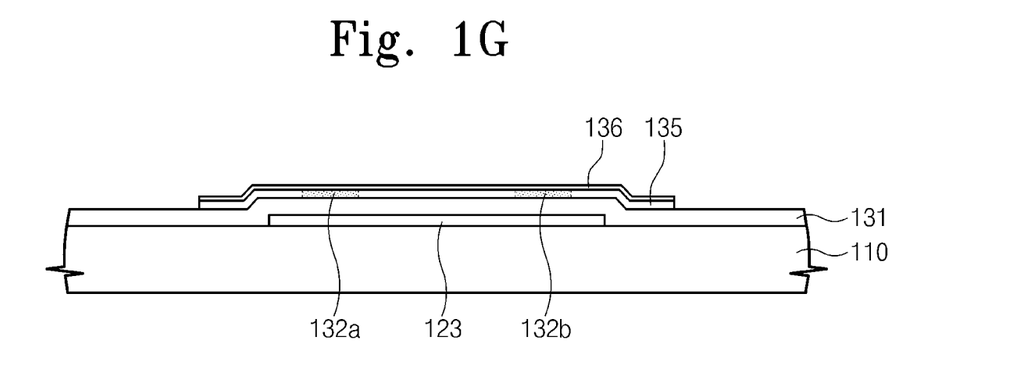

Referring to FIG. 1G, the FERTA process causes a silicon oxide (SiOx) layer 136 to be formed on the active pattern 135. The silicon oxide layer 136 is about 10 Å to about 100 Å thick, which may be thicker than a natural oxide layer. Further, the silicon oxide layer 136 preferably has a thickness of about 30 Å to about 100 Å. The silicon oxide layer 136 is not removed through a subsequent HF cleaning process because the silicon oxide layer 136 is firmly formed as compared with the natural oxide layer.

Figure 1H:
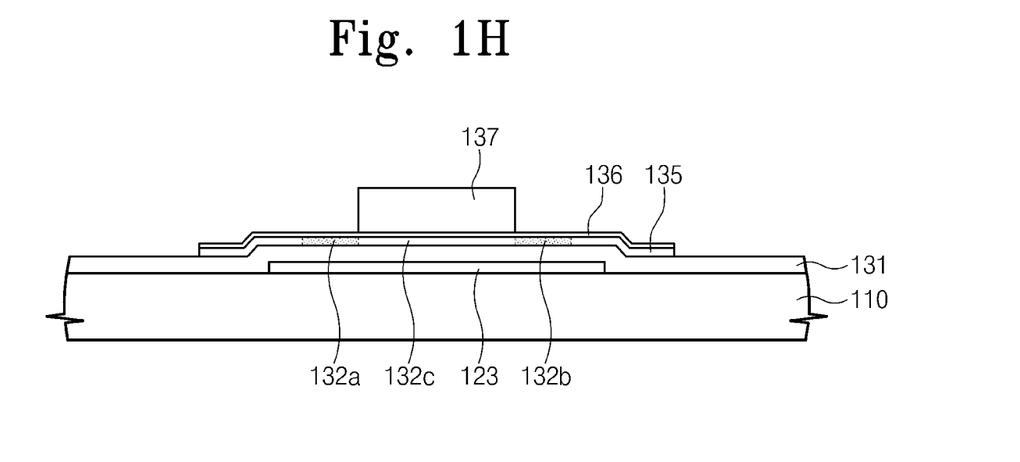

Next, referring to FIG. 1H, a fourth photoresist pattern 137 is formed on the silicon oxide layer 136. The silicon oxide layer 136 is etched through a photolithography process using the fourth photoresist pattern 137 as a mask, thereby forming a silicon oxide layer pattern 138. The fourth photoresist pattern 137 is formed only on a channel region 132c of the active pattern 135. Thus, the silicon oxide layer pattern 138 is removed from the n+ and p+ doped regions 132a and 132b and remains only on the channel region 132c, as illustrated in FIG. 1I.

Figure 1I:
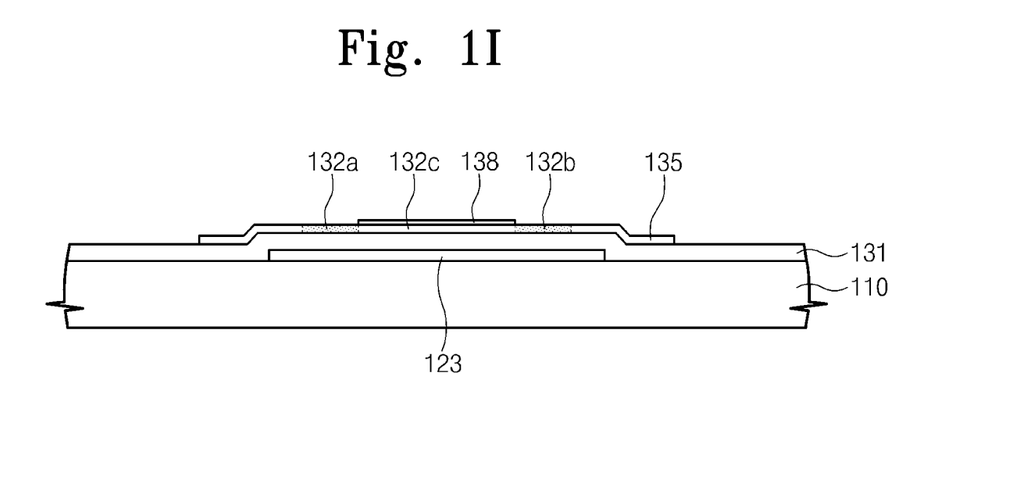

As illustrated in FIG. 1I, the active pattern 135 includes the n+ and p+ doped regions 132a and 132b, the channel region 132c between the n+ and p+ doped regions 132a and 132b, and undoped regions around the n+ and p+ doped regions 132a and 132b.

Figure 1J:
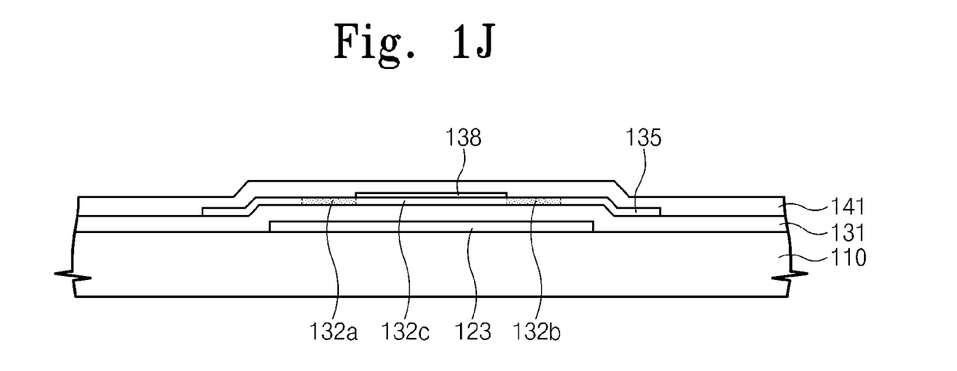

Referring to FIG. 1J, a data metal layer 141 is deposited on the gate insulating layer 131 on which the active pattern 135 and the silicon oxide layer pattern 138 are formed. In the present exemplary embodiment, the data metal layer 141 has a triple layer structure in which a first molybdenum layer, an aluminum layer and a second molybdenum layer are sequentially laminated, and the layers have thicknesses of about 300 Å, about 2500 Å and about 1000 Å, respectively.

Figure 1K:
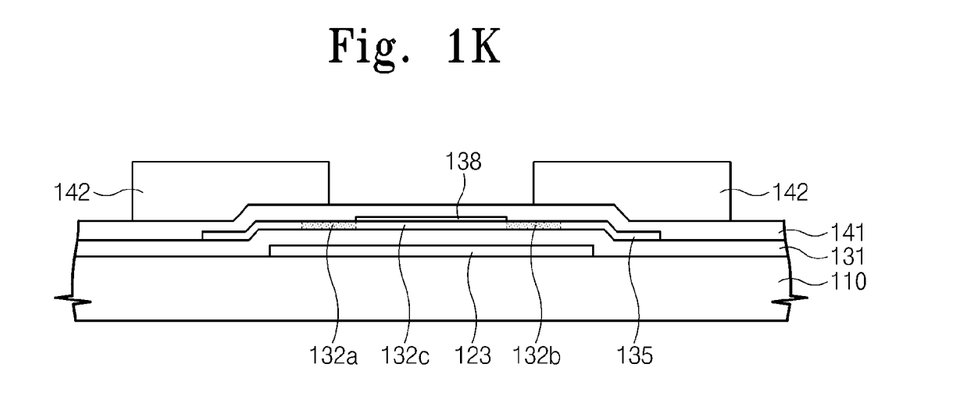
Figure 1L:
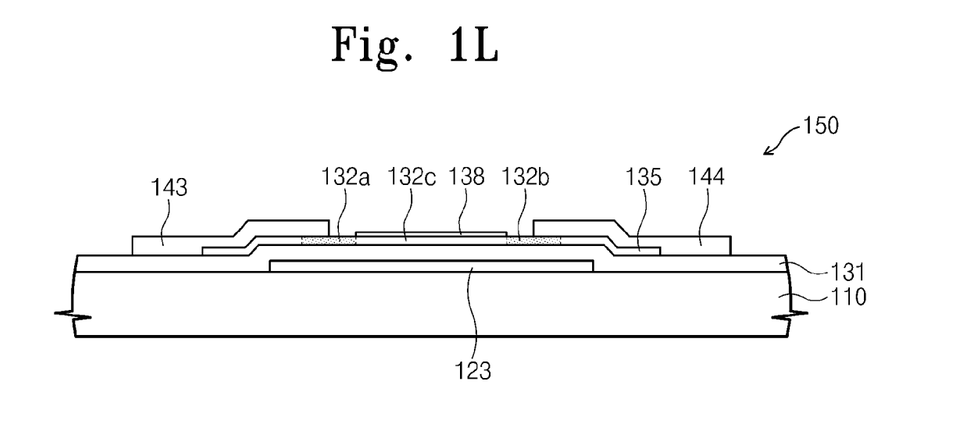

As illustrated in FIG. 1K, a fifth photoresist pattern 142 is formed on the data metal layer 141. Then, the data metal layer 141 is etched through a photolithography process using the fifth photoresist pattern 142 as a mask, thereby forming a source electrode 143 and drain electrode 144 as illustrated in FIG. 1L. The source electrode 143 overlaps with the n+ doped region 132a and the undoped region of the active pattern 135, and the drain electrode 144 overlaps with the p+ doped region 132b and the undoped region of the active pattern 135. Thus, a polysilicon transistor 150 is completely formed on the substrate 110.

The silicon oxide layer pattern 138 covers the channel region 132c of the active pattern 135 to serve as a protective layer that protects the channel region 132c, thereby preventing damage to the channel region 132c during the process of etching the source and drain electrodes 143 and 144.

Further, the silicon oxide layer pattern 138 is removed from the n+ and p+ doped regions 132a and 132b, so that ohmic contact properties of the polysilicon transistor 150 may be improved. Consequently, an off current of the polysilicon transistor 150 may be reduced.

Figure 2:
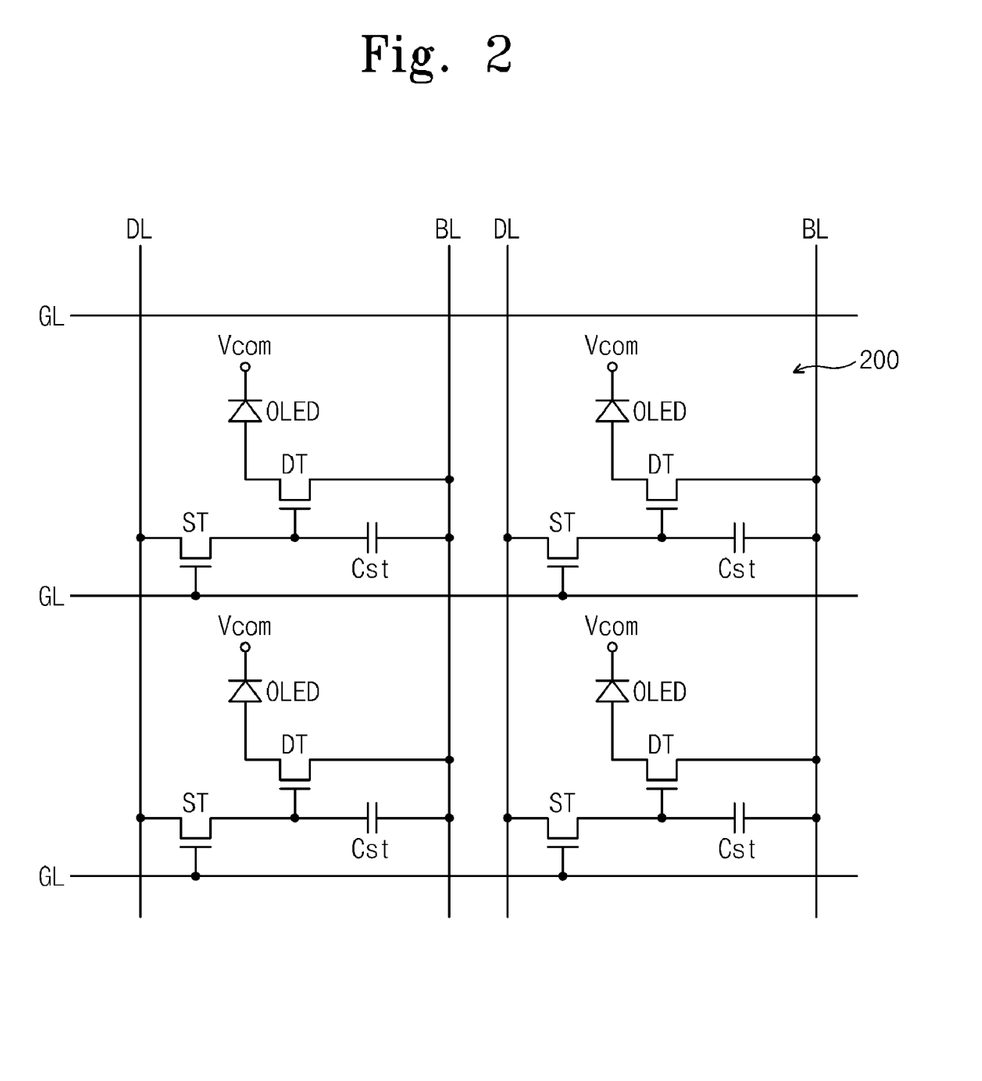
FIG. 2 is a circuit diagram illustrating an organic electroluminescence display according to an exemplary embodiment of the present invention.

FIG. 2 is a circuit diagram illustrating an organic electroluminescence display according to an exemplary embodiment of the present invention. FIG. 2 shows only four of a plurality of pixels provided in the organic electroluminescence display.

Referring to FIG. 2, each pixel 200 includes a switching transistor ST, a driving transistor DT, am image retention capacitor $C_{st}$ and an organic electroluminescence device OLED, which are provided in a pixel area defined by data lines DL, gate lines GL, and bias lines BL.

The switching transistor ST includes a source electrode connected to the data line DL, a gate electrode connected to the gate line GL, and a drain electrode connected to the driving transistor DT. Thus, the switching transistor ST outputs a data signal applied to the data line DL through the drain electrode in response to a gate signal applied to the gate line GL.

The driving transistor DT includes a gate electrode connected to the drain electrode of the switching transistor ST, a source electrode connected to the bias line BL, and a drain electrode connected to the organic electroluminescence device. Thus, the driving transistor DT turns on or off in response to voltage variation of the data signal supplied from the switching transistor ST to control a light emitting operation of the organic electroluminescence device OLED.

The organic electroluminescence device OLED is prepared in the form of a diode including a first electrode connected to the drain electrode of the driving transistor DT, and a second electrode receiving a common voltage $V_{com}$. An organic light emitting layer (not shown) is interposed between the first and second electrodes. The organic light emitting layer includes organic material, which has a red, green or blue color that varies in the unit of a pixel.

A bias voltage is applied to the bias line BL. When the driving transistor DT is a P type transistor, the bias voltage has a level higher than that of the common voltage $V_{com}$ connected with the organic electroluminescence device OLED. When the driving transistor DT is an N type transistor, the bias voltage has a level lower than that of the common voltage $V_{com}$.

The image retention capacitor $C_{st}$ is connected between the drain electrode of the switching transistor ST and the bias line BL to accumulate charges therein by the data signal output from the drain electrode and the bias voltage.

The driving transistor DT is turned on by the charges accumulated in the image retention capacitor $C_{st}$, so that a current output from the drain electrode of the driving transistor DT is provided to the first electrode of the organic electroluminescence device OLED. Thus, intensity of light emitted from the organic electroluminescence device OLED is determined according to the amount of the current output from the driving transistor DT, thereby displaying an image having a desired gray scale.

FIG. 3A, FIG. 3B, FIG. 3C, FIG. 3D, FIG. 3E, FIG. 3F, FIG. 3G, FIG. 3H, FIG. 3I and FIG. 3J are sectional views illustrating a manufacturing process of the pixel as shown in FIG. 2. Since a process of forming a driving transistor on a substrate is identical to the manufacturing process of the transistor as shown in FIG. 1A, FIG. 1B, FIG. 1C, FIG. 1D, FIG. 1E, FIG. 1F, FIG. 1G, FIG. 1H, FIG. 1I, FIG. 1J, FIG. 1K and FIG. 1L, a detailed description thereof will be omitted.

Figure 3A:
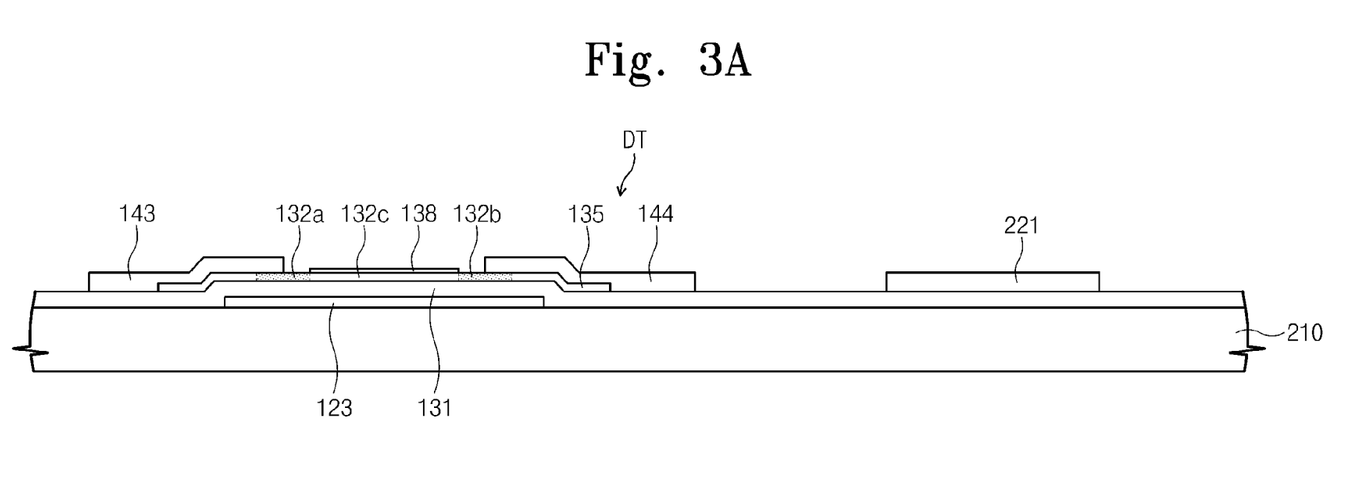
FIG. 3A, FIG. 3B, FIG. 3C, FIG. 3D, FIG. 3E, FIG. 3F, FIG. 3G, FIG. 3H, FIG. 3I and FIG. 3J are sectional views illustrating a manufacturing process of the pixel as shown in FIG. 2.

Referring to FIG. 3A, in the process of forming the source electrode 143 and drain electrode 144 of the driving transistor DT, a gate electrode 221 of the switching transistor ST (see FIG. 2) is formed.

Figure 3B:
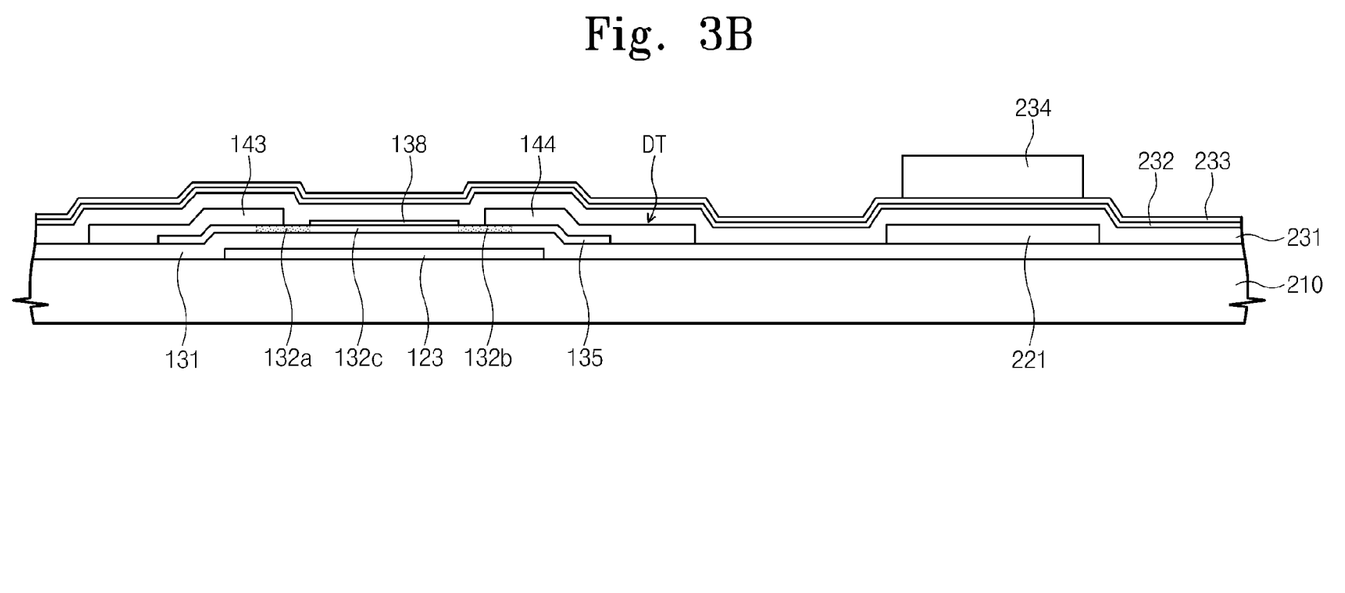

Then, as illustrated in FIG. 3B, a gate insulating layer 231 is formed to cover the source and drain electrodes 143 and 144 of the driving transistor DT, and the gate electrode 221 of the switching transistor ST. An amorphous silicon layer 232 and an n+ amorphous silicon layer 233 are sequentially formed on the gate insulating layer 231.

Figure 3C:
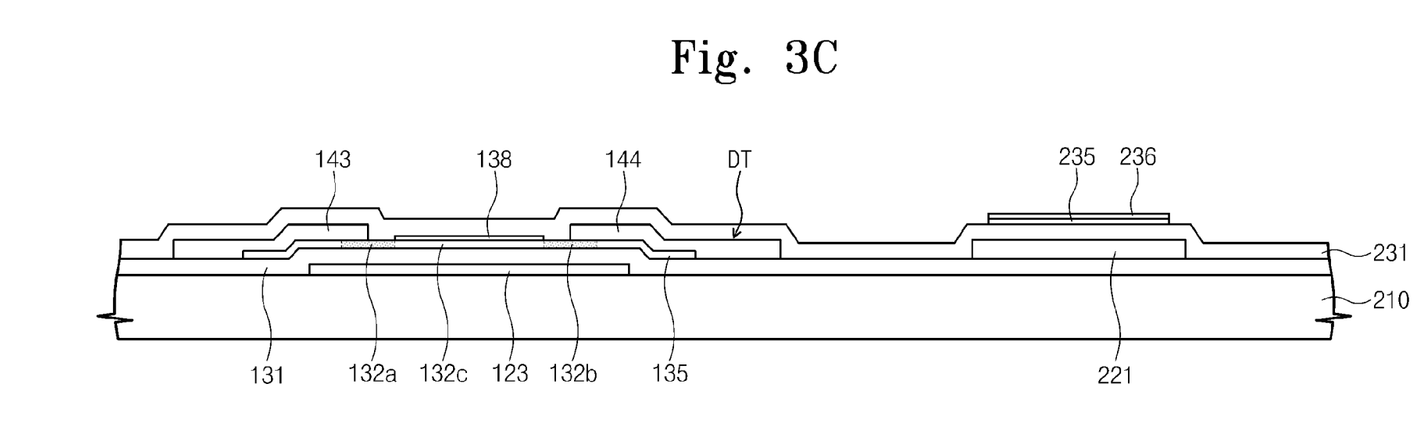

Further, a sixth photoresist pattern 234 is formed above the gate electrode 221 of the switching transistor ST. The amorphous silicon layer 232 and the n+ amorphous silicon layer 233 are patterned through a photolithography process using the sixth photoresist pattern 234 as a mask, so that an active pattern 235 and an ohmic contact pattern 236 are formed above the gate electrode 221, as illustrated in FIG. 3C.

Figure 3D:
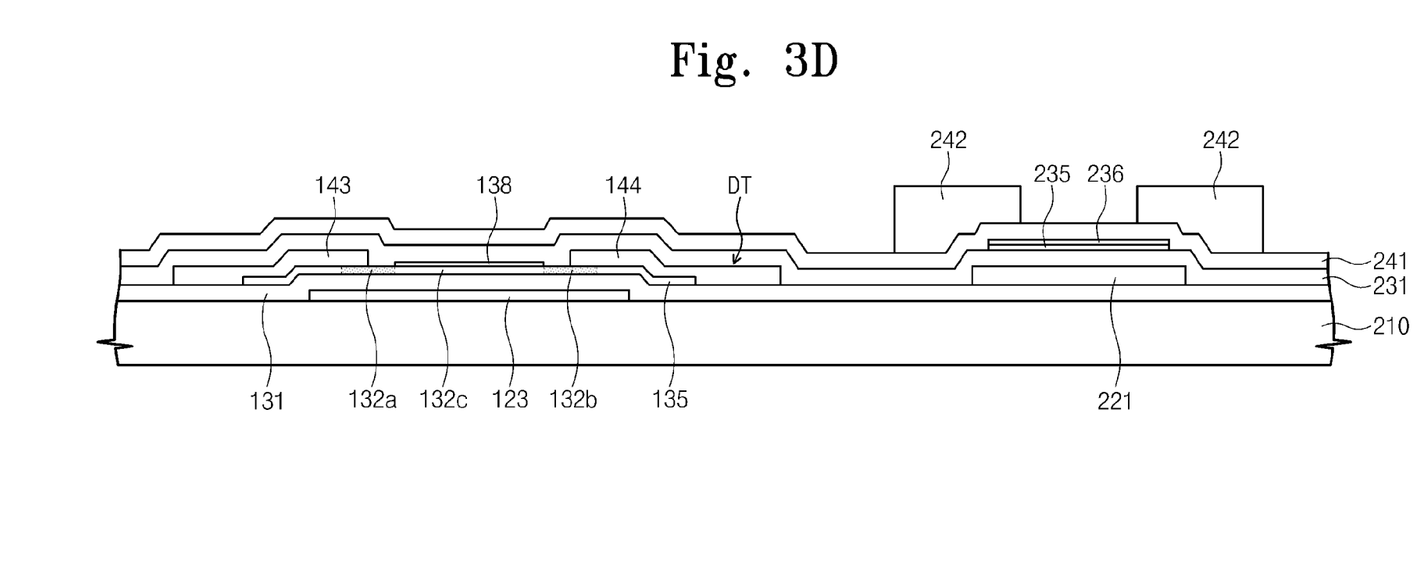

Referring to FIG. 3D, a data metal layer 241 is formed on the gate insulating layer 231 to cover the active pattern 235 and the ohmic contact pattern 236, and a seventh photoresist pattern 242 is formed on the data metal layer 241. The data metal layer 241 has a triple layer structure in which a first molybdenum (Mo) layer, an AlNd layer and a second molybdenum (Mo) layer are sequentially laminated.

Figure 3E:
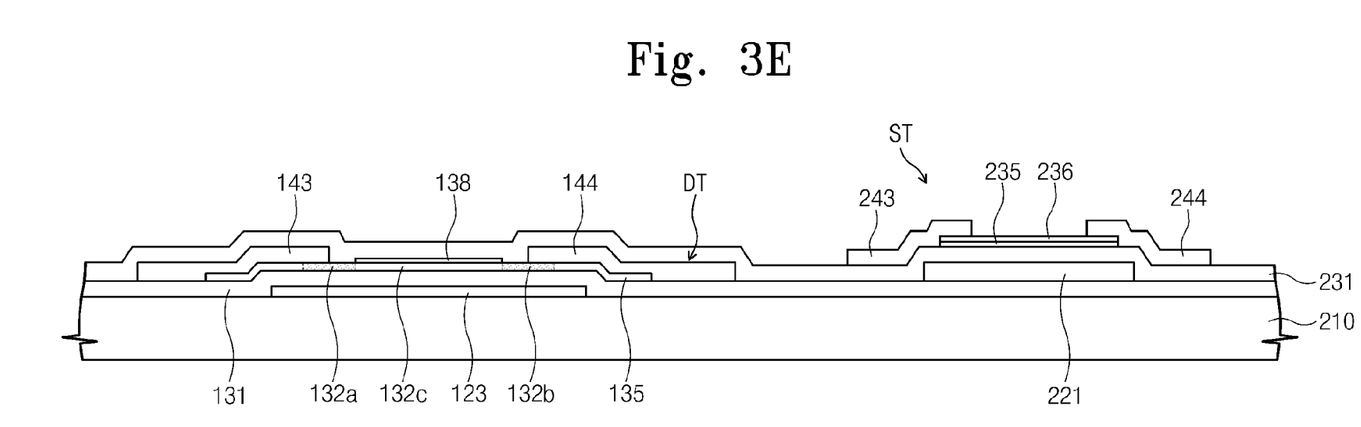

As illustrated in FIG. 3E, the data metal layer 241 is patterned through a photolithography process using the seventh photoresist pattern 242 as a mask, so that source electrode 243 and drain electrode 244, which overlap with the ohmic contact pattern 236, are formed, thereby completing fabrication of the switching transistor ST on a substrate 210.

Figure 3F:
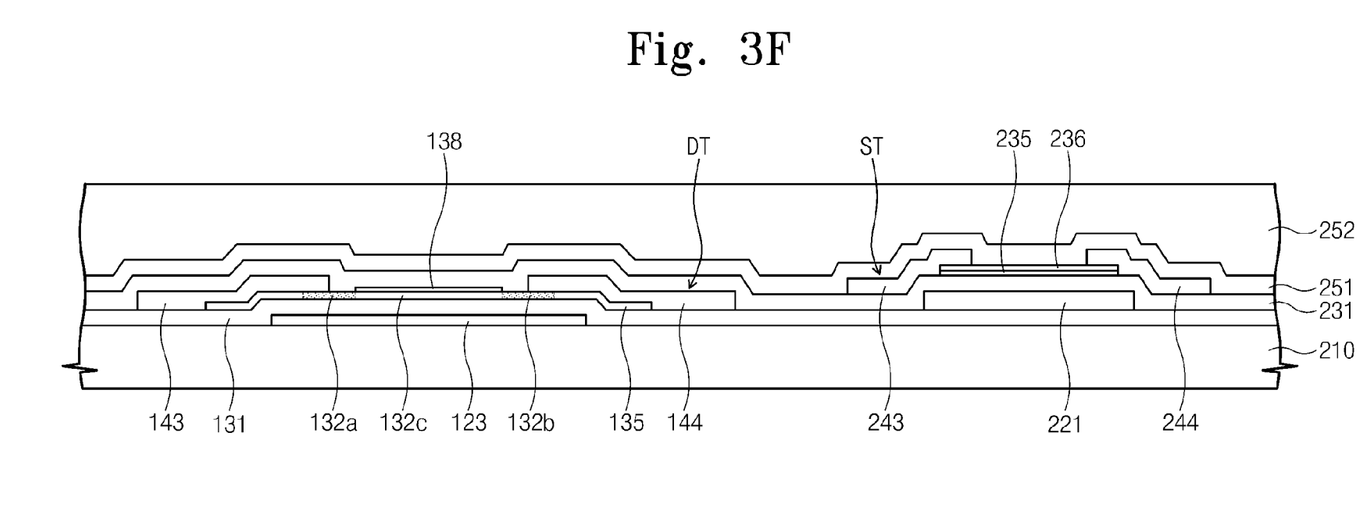

Referring to FIG. 3F, a protective layer 251 is formed on the substrate 210 to cover the switching transistor ST, and an organic insulating layer 252 is formed on the protective layer 251. The protective layer 251 includes a silicon nitride (SiNx) layer, and has a thickness of about 2000 Å. The organic insulating layer 252 includes acryl-based resin and has a thickness of about 1 µm to about 3 µm.

Figure 3G:
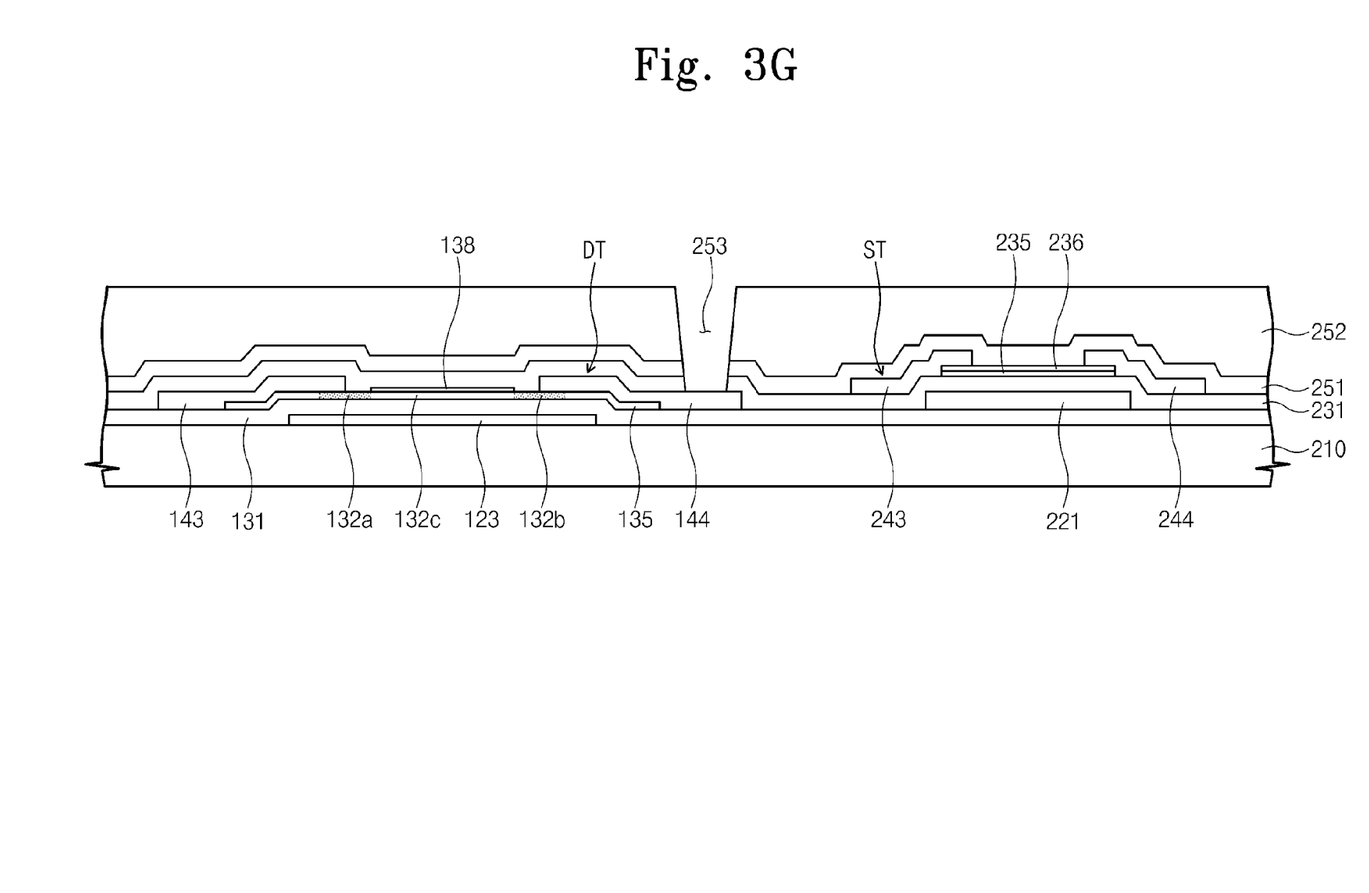

Referring to FIG. 3G, a contact hole 253 is formed in the gate insulating layer 231, the protective layer 251, and the organic insulating layer 252 to expose the drain electrode 144 of the driving transistor DT.

Figure 3H:
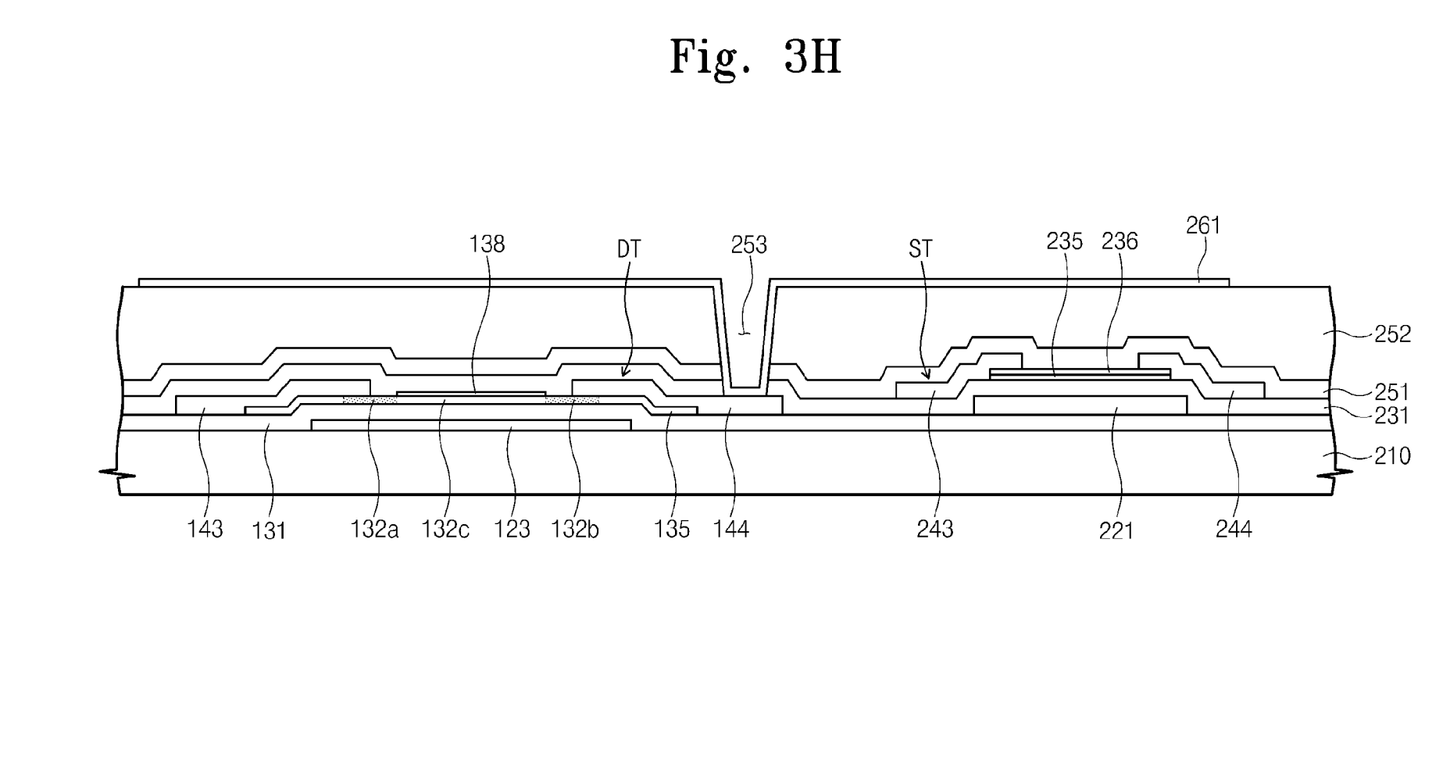

Referring to FIG. 3H, a transparent conductive layer including material such as indium zinc oxide (IZO) is formed on the organic insulating layer 252, which is then patterned to form a first electrode 261 of the organic electroluminescence device OLED shown in FIG. 2. The first electrode 261 is electrically connected with the drain electrode 144 of the driving transistor DT through the contact hole 253.

Figure 3I:
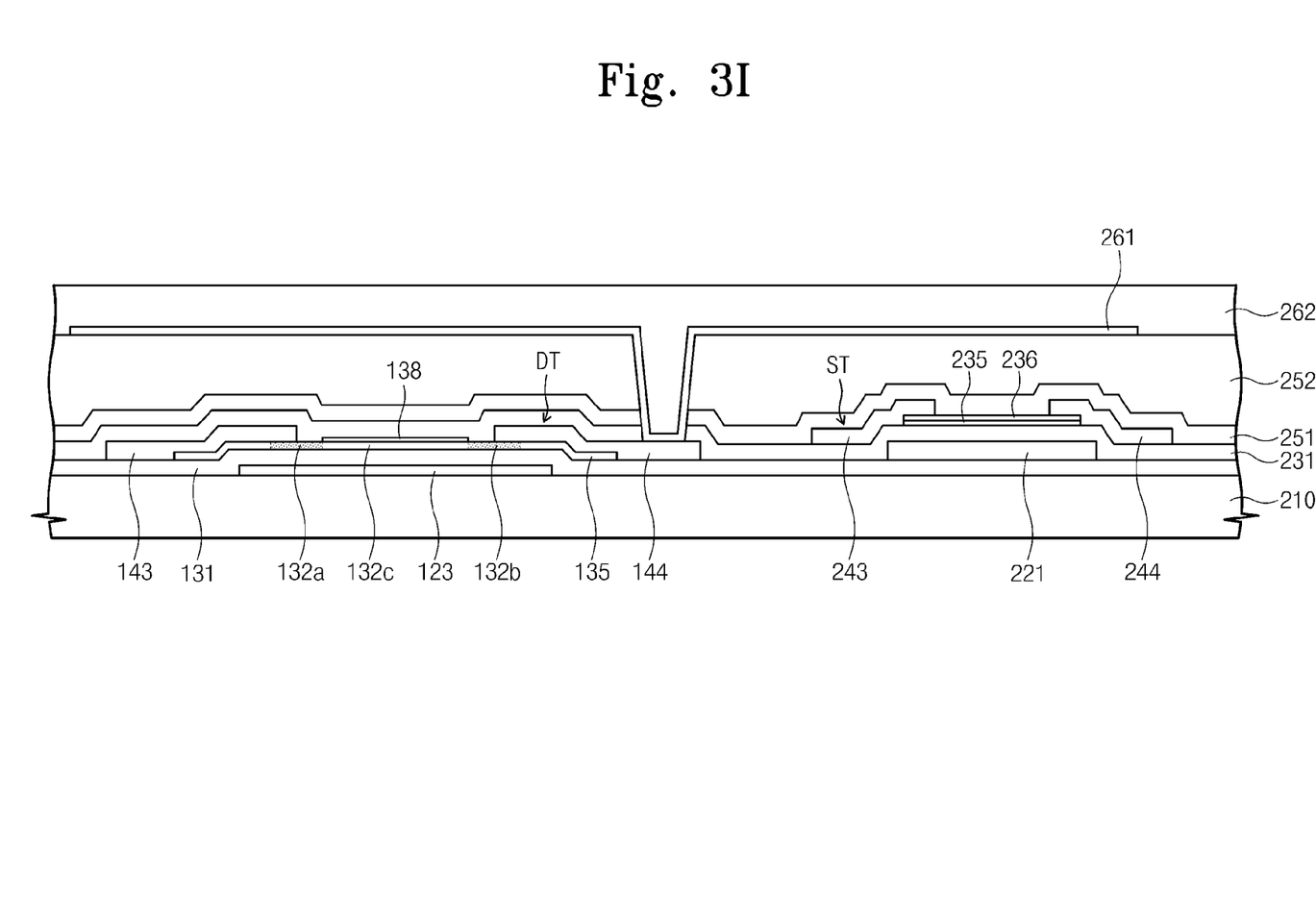

Next, referring to FIG. 3I, an organic light emitting layer 262 is formed on the first electrode 261. The organic light emitting layer 262 may include a hole injection layer, a hole transfer layer, a light emitting layer and an electron transfer layer sequentially laminated.

Figure 3J:
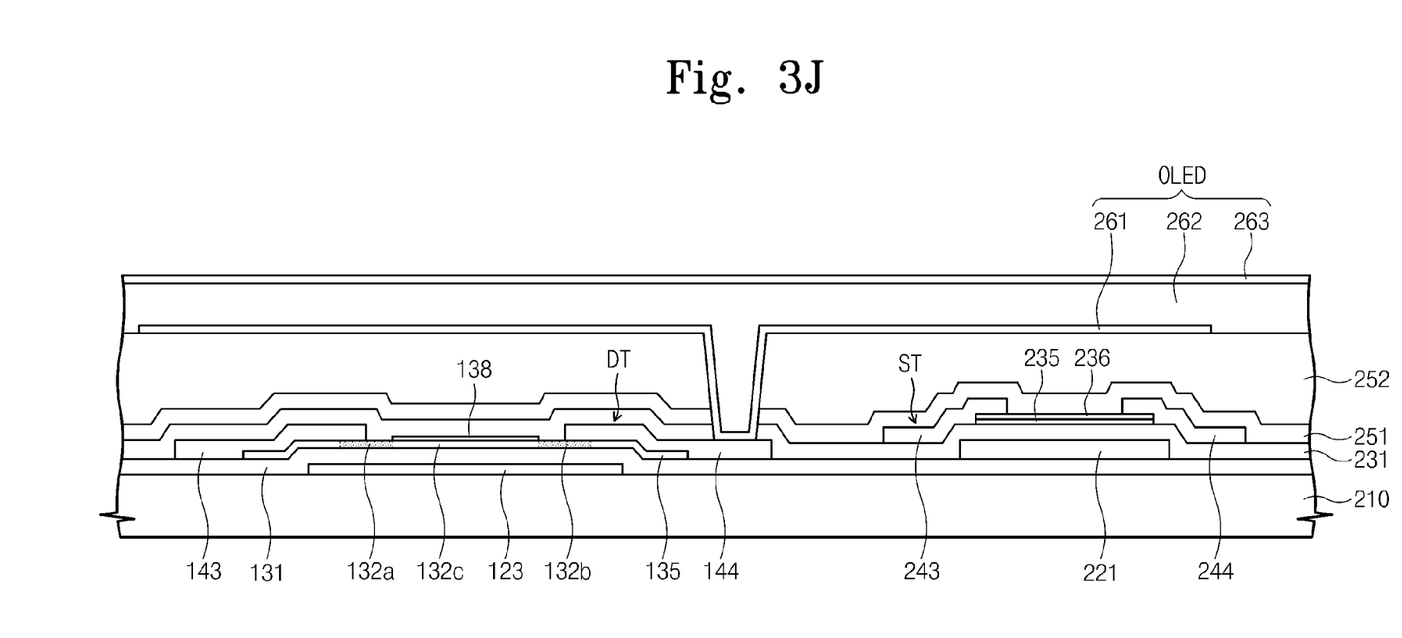

Referring to FIG. 3J, a second electrode 263 of the organic electroluminescence device OLED is formed on the organic light emitting layer 262. In the case of a bottom emission device, the second electrode 263 includes a metal material containing magnesium (Mg), lithium (Li) and calcium (Ca). Through the above processes, the pixel 200 can be formed on the substrate 210.

As illustrated in FIG. 3J, the silicon oxide layer pattern 138 covers the channel region 132c of the driving transistor DT to serve as a protective layer that protects the channel region 132c, thereby preventing damage to the channel region 132c during the process of etching the source and drain electrodes 143 and 144.

Further, the silicon oxide layer pattern 138 is removed from the n+ and p+ doped regions 132a and 132b, so that ohmic contact properties of the driving transistor DT may be improved. Consequently, an off current of the driving transistor DT may be reduced.

As illustrated in FIG. 2, since the driving transistor DT is connected with the organic electroluminescence device OLED, characteristics of the driving transistor DT exert influence upon the display quality of the organic electroluminescence display. In particular, the off current of the driving transistor DT is reduced by the silicon oxide layer pattern 138 to increase a contrast ratio of the organic electroluminescence display, so that the display quality of the organic electroluminescence display may be improved.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a transistor, the method comprising:

forming a gate electrode on a substrate;

forming a gate insulating layer on the substrate having the gate electrode;

forming an amorphous silicon layer on the gate insulating layer;

implanting impurity ions into a first region and a second region of the amorphous silicon layer to form a first doped region and a second doped region in the amorphous silicon layer;

patterning the amorphous silicon layer having the first doped region and the second doped region, the patterned amorphous silicon layer further comprising an undoped region positioned at an edge portion thereof;

while crystallizing the patterned amorphous silicon layer to form a polysilicon layer, forming a silicon oxide layer pattern covering a channel region of the polysilicon layer, the channel region being disposed between the first doped region and the second doped region; and forming a source electrode directly connected to the first doped region and the undoped region of the polysilicon layer and a drain electrode directly connected to the second doped region and the undoped region of the polysilicon layer.

2. The method of claim 1, wherein forming the silicon oxide layer pattern comprises patterning a silicon oxide layer, the silicon oxide layer being formed on the polysilicon layer during crystallization of the amorphous silicon layer.

3. The method of claim 2, wherein patterning the silicon oxide layer comprises:

forming a photoresist pattern on the silicon oxide layer at a position corresponding to the channel region; and removing the silicon oxide layer on the first doped region and the second doped region by performing a photolithography process using the photoresist pattern as a mask.

4. The method of claim 2, wherein crystallizing the amorphous silicon layer comprises a field enhanced rapid thermal annealing (FERTA) process.

5. The method of claim 4, wherein the silicon oxide layer pattern has a thickness of 10 Å to 100 Å.

6. The method of claim 1, wherein the silicon oxide layer pattern is not disposed on the first doped region and the second doped region.

* * * * *